United States Patent [19]

Mori et al.

[11] Patent Number: 5,456,001
[45] Date of Patent: Oct. 10, 1995

[54] APPARATUS FOR AUTOMATICALLY PACKAGING ELECTRONIC PARTS ON PRINTED CIRCUIT BOARD

[75] Inventors: Yasuo Mori, Sagamihara; Tomoaki Yasuda, Hino; Hideyuki Sakai, Tokorozawa, all of Japan

[73] Assignee: Olympus Optical Co. Ltd., Tokyo, Japan

[21] Appl. No.: 76,913

[22] Filed: Jun. 15, 1993

[30] Foreign Application Priority Data

Jun. 19, 1992 [JP] Japan ..................... 4-186280

[51] Int. Cl.$^6$ .................... B23P 19/04; B23P 21/00; H05K 3/30
[52] U.S. Cl. .................. 29/739; 29/703; 29/721; 29/740; 29/741
[58] Field of Search .................. 29/721, 739–742, 29/703, 759, 760, 786, 793, 836; 364/555

[56] References Cited

U.S. PATENT DOCUMENTS

| | | | |
|---|---|---|---|
| 4,683,644 | 8/1987 | Tange et al. | 29/740 |
| 4,922,434 | 5/1990 | Fule | 29/759 X |
| 4,951,383 | 8/1990 | Amao et al. | 29/721 |
| 5,195,235 | 3/1993 | Mifuji | 29/721 |
| 5,255,429 | 10/1993 | Nishi et al. | 29/740 X |

FOREIGN PATENT DOCUMENTS

| | | | |
|---|---|---|---|
| 3630178 | 3/1988 | Germany | 29/740 |
| 61-121398 | 6/1986 | Japan | |
| 3120897 | 5/1991 | Japan | |
| 5037196 | 2/1993 | Japan | 29/740 |
| 5074883 | 3/1993 | Japan | 29/740 |

*Primary Examiner*—Peter Vo
*Attorney, Agent, or Firm*—Ostrolenk, Faber, Gerb & Soffen

[57] ABSTRACT

An automated pick-and-place apparatus for assembling a printed circuit board includes a housing portion for housing a plurality of electronic component dispensing mechanisms. A packaging portion is included in which selected component dispensing units are placed from which components are individually picked by a mounting device and mounted on the printed circuit board in predetermined locations. Each of the component dispensing units is provided with a data storage unit for reading and writing type and quantity information concerning the respective electronic components. A production manager determines the types and quantities of electronic components needed for production of a variety of printed circuit boards and generates a production schedule depending upon the type of board to be assembled. A control device controls operation of the mounting device, read\write means and transfer means for controlling assembly of the printed circuit board in accordance with the production manager. By automating generating of the production schedule and coupling the controlling device and the production manager, changer-over from one type of printed circuit board to another occurs in a completely automated fashion without any manual intervention. Additionally, a robotic conveying means may be controlled to transfer component dispensing means from a remote storage means to the assembly device.

19 Claims, 6 Drawing Sheets

APPARATUS FOR AUTOMATICALLY PACKAGING ELECTRONIC PARTS ON PRINTED CIRCUIT BOARD

BACKGROUND OF THE INVENTION (1) Field Of The Invention

The present invention relates generally to an apparatus for automatically packaging electronic parts on a printed circuit board and, more particularly, to an automatic electronic part packaging apparatus capable of automatically placing and replacing a part supply unit holding the electronic parts in a packaging portion with respect to the printed circuit board.

(2) Related Art Statement

The packaging of the electronic parts on a printed circuit board (PCB) involves the use of a plurality of part supply units for holding electronic parts. The electronic parts are picked up from this part supply unit and mounted in predetermined locations of the PCB. For this purpose, the electronic part automatic packaging apparatus incorporates a function to automatically replace the part supply unit.

Figure 6:
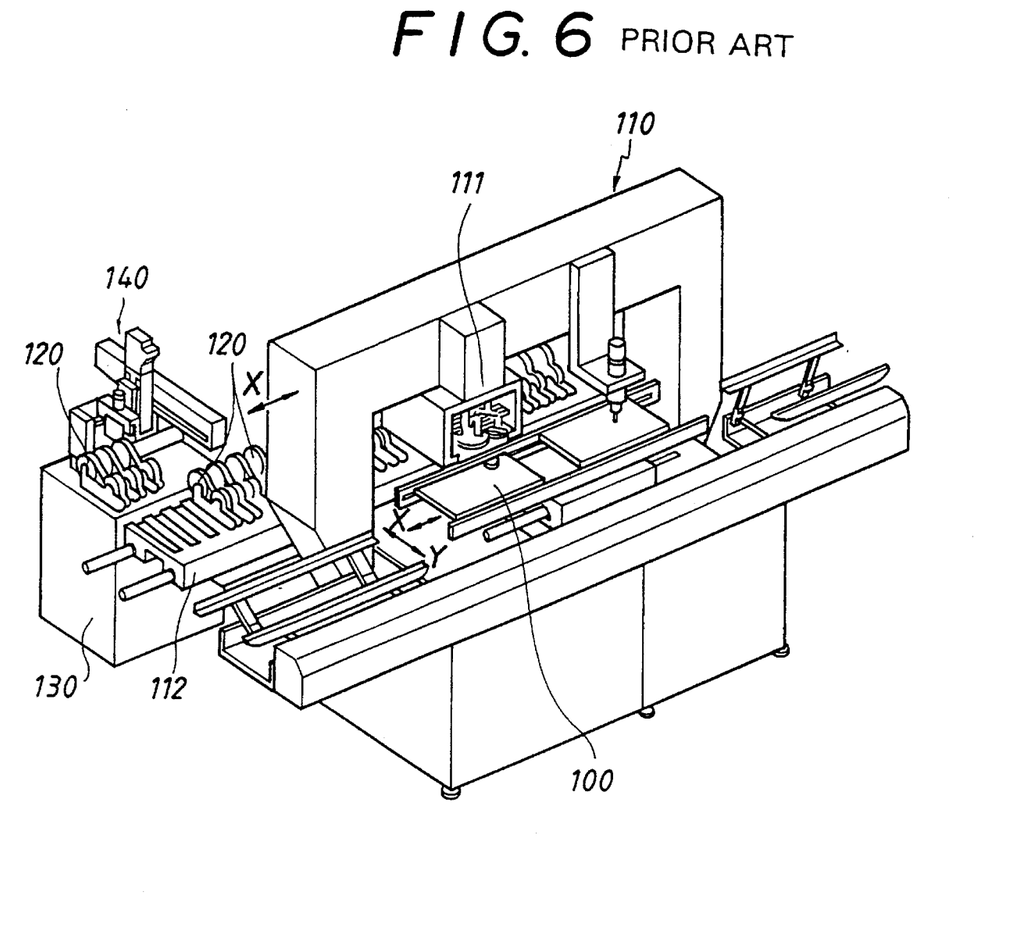
FIG. 6 is a perspective view showing the whole of a conventional example.

FIG. 6 illustrates a conventional electronic part automatic packaging apparatus equipped with the part supply units that is disclosed in Japanese Patent Laid-Open Publication No.61-121398. This packaging apparatus is equipped with: a packaging portion 110 supplied with PCBs 100; a housing portion 130 for housing a plurality of part supply units 120; and a transfer portion 140 for transferring the part supply unit 120 to the packaging portion from the housing portion 130. The packaging portion 110 includes a packaging device 111 for packaging the electronic parts on the PCB 100 while moving in directions X and Y; and a mounting board 112, reciprocating in the x direction, on which the plurality of part supply units 120 are arranged. The PCBs 100 are sequentially fed to the packaging device 111 in the direction X. The packaging device picks up necessary electronic parts out of the part supply unit 120 on the mounting board 112 and packages them in predetermined locations of the PCB 100. The transfer portion 140 transfers the part supply units 120 stocked in the housing portion 130 onto the mounting board 112 and thereafter mounts these units on the mounting board 112.

The operations of the respective portions in this packaging apparatus are controlled by an unillustrated centralized control device. The number of parts of each of the part supply units 120 is inputted to the centralized control device. At the same time, the centralized control device is provided with a counter for counting the number of electronic parts every time the packaging device 111 packages the electronic part. The centralized control device further includes a notifying means (not shown) for giving an advance notice when the residual quantity after being counted by this counter reaches a set value.

Next, the operation of this electronic part automatic packaging apparatus will be explained. In the course of packaging the electronic parts on the PCB 100, the counter of the centralized control device counts the residual quantity of the parts of the specific part supply unit 120 on the mounting board 112 up to, e.g., 200–300. Then, the notifying means makes a first out-of-stock notification of the parts and informs the worker of this notice. When making the first out-of-stock notification of the parts, the worker brings the same kind of the part supply unit 120 holding the electronic parts as those of the part supply unit 120 from a stocker. The worker then places the unit 120 in an empty location in the housing portion 130. Thereafter, the electronic parts are continuously packaged, and when the residual quantity of the part supply unit 120 comes to, e.g., 20–30, the notifying means makes a second out-of-stock notification of the parts.

With the second out-of-stock notification of the parts, the packaging of the electronic parts on the PCB 100 is ended. When replacing the PCB 100, the transfer portion 140 works to place the part supply unit 120 holding the same kind of electronic parts in an empty location of the mounting board 112 from the housing portion 130. Then, after setting the new part supply unit 120 in the empty location, the packaging of the next electronic parts on the PCB 100 is started.

Further, the packaging of the electronic parts continues, and when the part supply unit 120 that has already received the out-of-stock notification of the parts comes to have no stock of the electronic parts, this is detected by a sensor (unillustrated) in the packaging device 111. Thereafter, the electronic parts are taken out of the new part supply unit 120, and the packaging of the parts continues.

Hereafter, when replacing the PCB 100 with an end of the packaging of the electronic parts on the PCB 100, the transfer portion 140 brings the empty part supply unit 120 containing no electronic part back to the housing portion 130. Simultaneously, the new part supply unit 120 is transferred to a location where the empty part supply unit 100 has been set. This apparatus is capable of preventing a decrease in availability factor due to a loss time when replacing the part supply unit because of the capability of replacing the part supply unit without stopping its working thereof.

By the way, a changeover to a different kind of PCB is conducted to package the electronic parts. When effecting this changeover to the PCB, the stage replacement requires a replacement with new part supply units by removing a large proportion of the part supply units from the mounting board 112.

The conventional apparatus, however, simply has a function to replace the part supply unit when in an out-of-stock condition. Therefore, the stage replacement has to be done by the worker. This is very time-consuming. Further, when the worker removes the part supply unit, there becomes unknown the information about a kind and a type of the electronic parts of the part supply unit or the number of remains thereof. A confirmation is also required to be made by the worker.

OBJECTS AND SUMMARY OF THE INVENTION

It is a primary object of the present invention, which has been devised in view of inconveniences inherent in the prior art described above, to provide an apparatus for automatically packaging electronic parts on a printed circuit board that is capable of easily grasping the information on the electronic parts even when removing a part supply unit.

Figure 1:
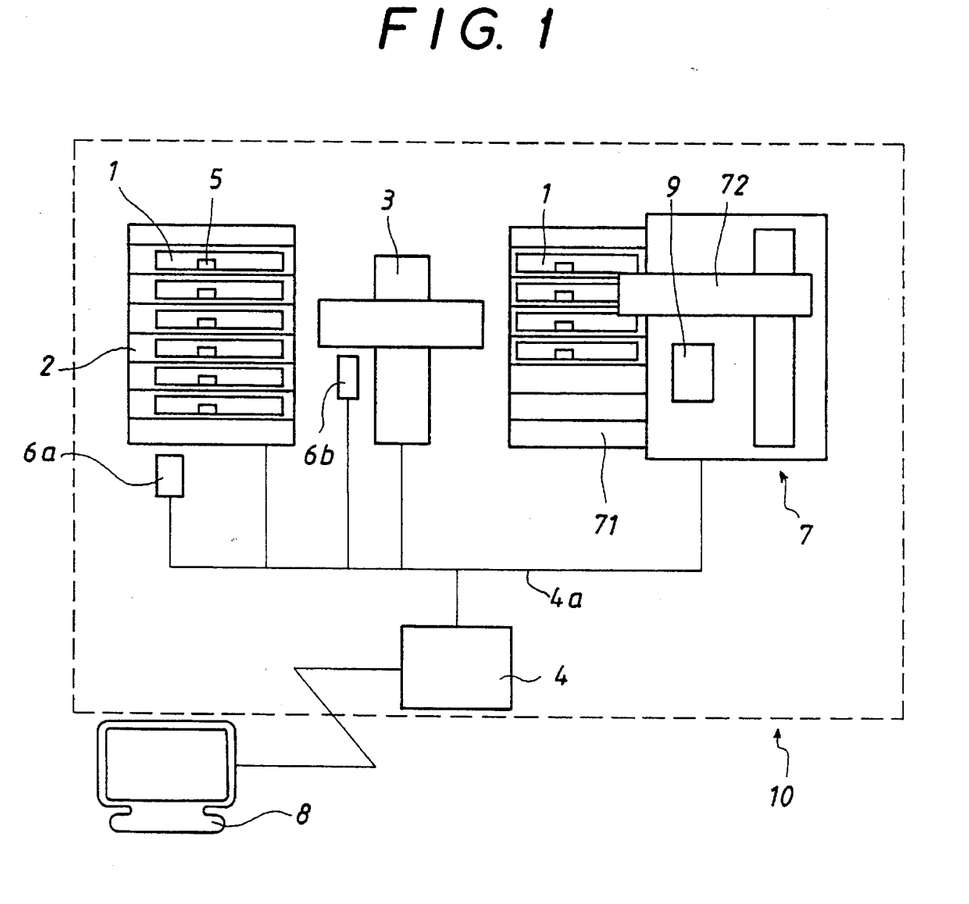
FIG. 1 is a flowchart conceptually illustrating an entire apparatus for automatically packaging electronic parts on a printed circuit board (PCB) according to this invention.

FIG. 1 is an explanatory view illustrating a basic configuration of an apparatus 10 for automatically packaging electronic parts on a printed circuit board according to the present invention. The automatic packaging apparatus 10 comprises a housing portion 2, a packaging portion 7, a transfer portion 3, an information storage unit 5, read/write means 6a and 6b, a control portion 4 and a production management instructing portion 8. The housing portion 2 houses a multiplicity of part supply units 1 each holding a plurality of electronic parts in a suppliable manner. The packaging portion 7 includes a mounting board 71 mounted with the multiplicity of part supply units 1 an in array. The packaging portion 7 packages the electronic parts on a printed circuit board (PCB) 9 by taking the parts out of the part supply unit 1 on the mounting board 71. The transfer portion 3 conveys the part supply units 1 onto the mounting board 71 from the housing portion 2 and transfers them in predetermined locations on the mounting board 71. Each part supply unit 1 is provided with the information storage unit 5 to which the electronic part information can be read and written. The read/write means 6a, 6b read and write the information with respect to the information storage unit 5. The control portion 4 controls the housing portion 2, the packaging portion 7, the transfer portion 3 and the read/write means 6a, 6b that are connected through a line 4a. The production management instructing portion 8 is capable of inputting and outputting the information on the PCBs 9. Based on this information, the production management instructing portion 8 instructs the control portion 4. A packaging device 72 picks up the electronic part from the part supply unit 1 on the mounting board 71. The packaging device 72 then transfers and packages the part on the PCB 9.

The transfer portion 3 acts to convey the part supply unit 1 stocked in the housing portion 2 to a predetermined location on the mounting board 71 and effect positioning thereof. At the same time, the transfer portion 3 acts to return the part supply unit 1 existing on the mounting board 71 to the housing portion 2. The read/write means 6a disposed in the housing portion 2 writes the information about the kind, the type and the quantity of the electronic parts to the information storage unit 5 of the part supply unit 1 when the part supply units 1 are stocked in the housing portion 2. Further, the read/write means disposed in the transfer portion 3 writes the information about the electronic parts to the information storage unit 5 of the part supply unit 1 returned to the housing portion after finishing the packaging of the electronic parts on the PCB 9. The production management instructing portion 8 gives an instruction of the electronic part information to the control portion 4. Based on the instruction, the control portion 4 selects the part supply units 1 needed for packaging from the housing portion 2. The control portion 4 simultaneously controls the transfer portion 3 to place the part supply units 1 on the mounting board 71.

As explained above, according to the present invention, the stage replacement of the part supply units can be automated. At the same time, the information on the electronic parts of the part supply units can be grasped. It is therefore possible to save labor and prevent a mistake as well.

Other features and advantages of the present invention will become apparent enough with the following explanation.

DETAILED DESCRIPTION OF THE PREFERRED EMBODIMENTS

[Embodiment 1]

Figure 2A:
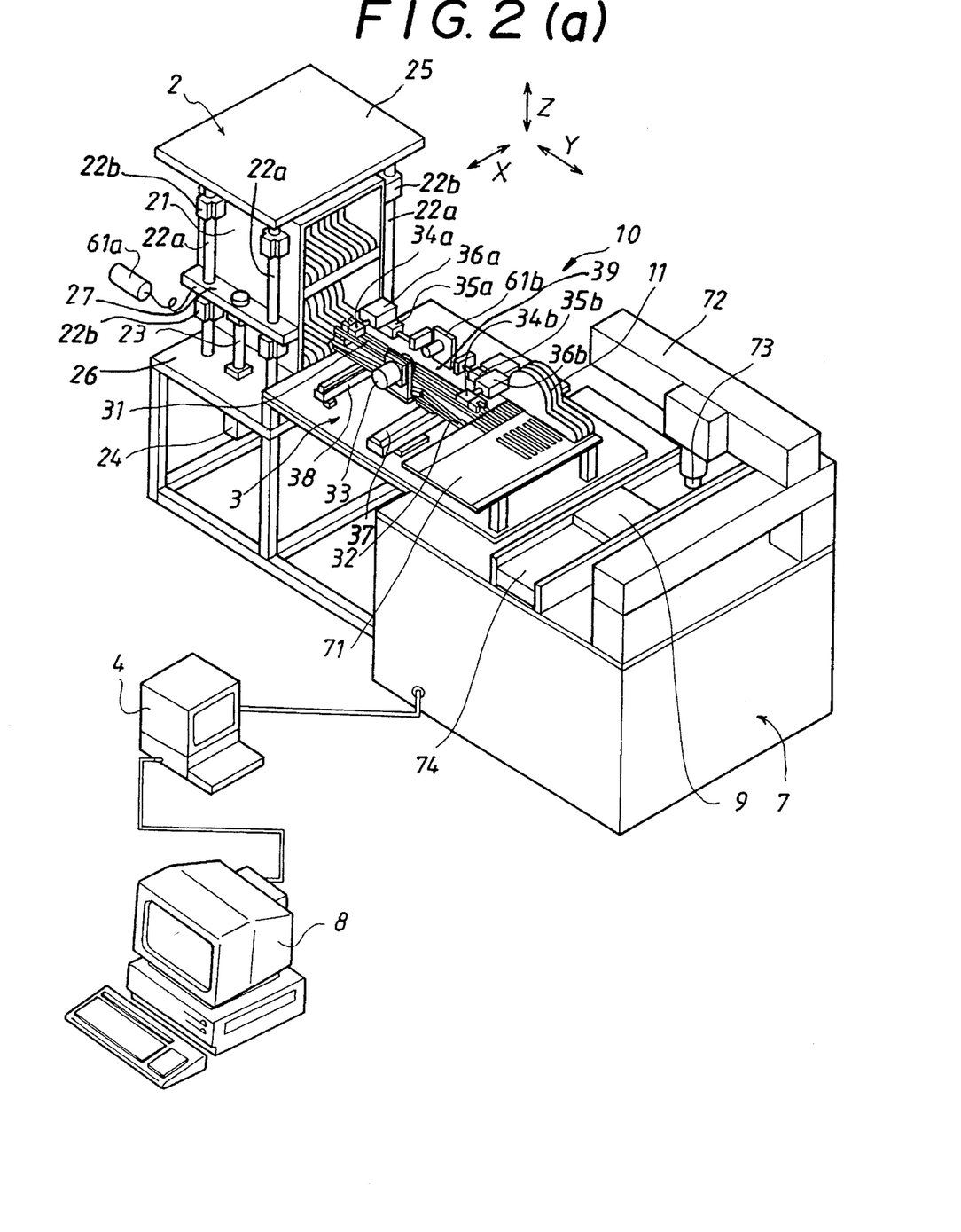
FIGS. 2(a) is a perspective views showing the whole of a first embodiment of the PCB electronic part automatic packaging apparatus of this invention.
Figure 2B:
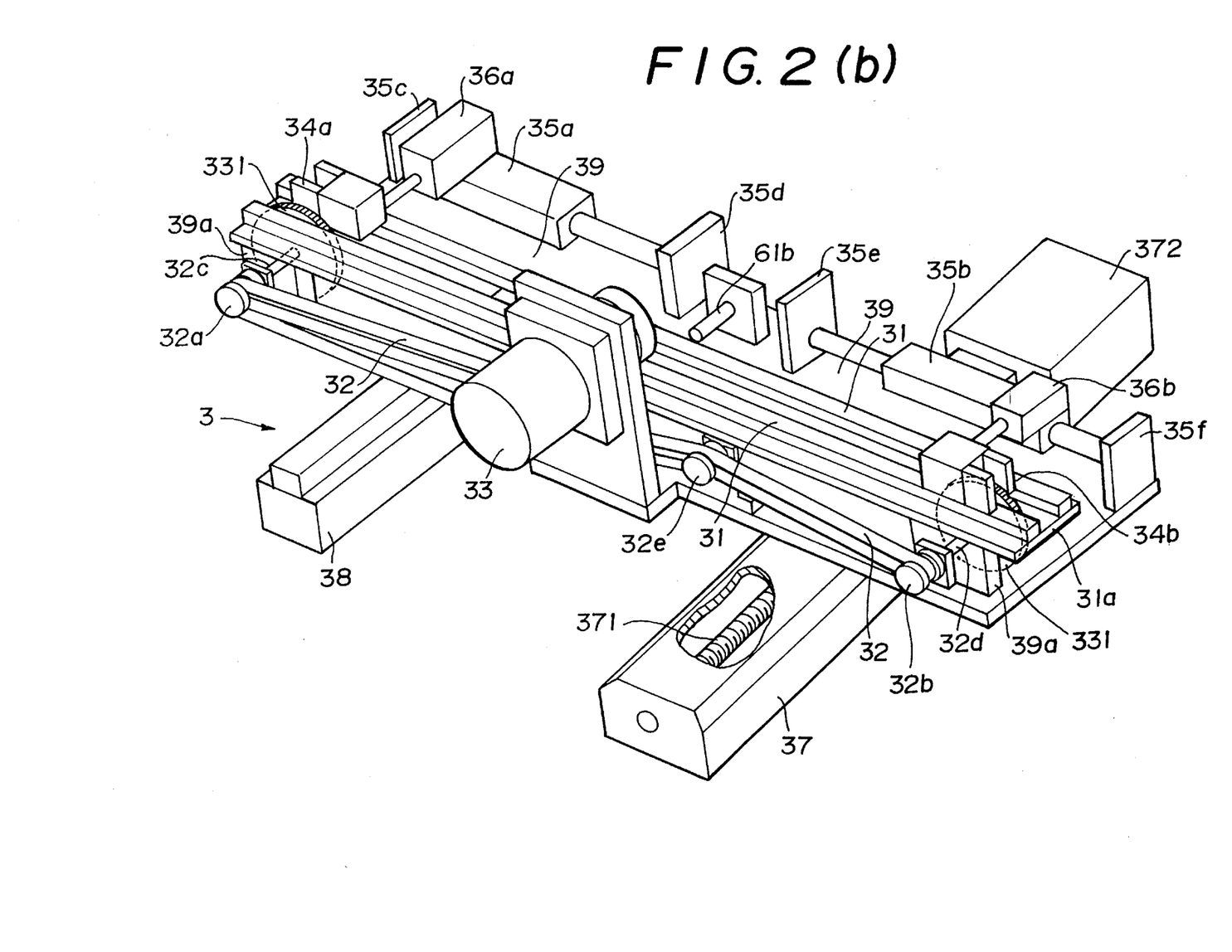
FIG. 2(b) is a perspective view fully illustrating the principal portion thereof.
Figure 3:
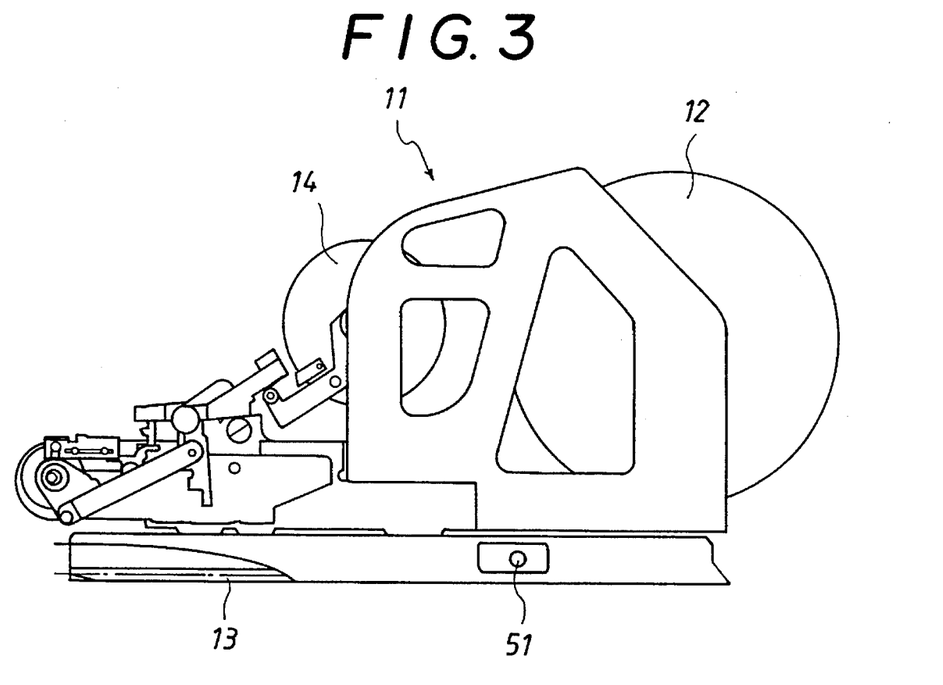
FIG. 3 is a side view of a tape feeding mechanism stocked in a stocker in accordance with the first embodiment of the PCB electronic part automatic packaging apparatus of this invention.

FIGS. 1 through 3 show an embodiment 1 of the present invention, wherein the same components as those in FIG. 1 are marked with the like symbols in correspondence thereto.

This embodiment involves the use of a tape feeding mechanism 11 illustrated in FIG. 3 as a part supply unit 1. This tape feeding mechanism 11 sequentially feeds the electronic parts in such a way that a take-up reel 14 takes up a tape, to which the electronic parts are attached, of a tape reel 12. Referring to FIG. 3, racks 13 are formed in the bottom of the tape feeding mechanism 11. A data carrier 51 is so embedded in a lower side surface of the tape feeding mechanism 11 as not to contact other members during the feed by the tape feeding mechanism 11. The tape feeding mechanism 11 serves as an information storage unit from which the information about the electronic parts is written and read.

An electronic part automatic packaging apparatus 10 (hereinafter simply referred to as an automatic packaging apparatus 10) is, though some portions illustrated in FIG. 2(b) are omitted as shown in FIG. 2(a), constructed of a packaging portion 7, a housing portion 2, a transfer portion 3, a control portion 4, carrier heads 61a, 61b and a production management instructing device 8. A plurality of tape feeding mechanisms 11 are, though some portions shown in FIG. 2(b) are omitted in FIG. 2(a), arranged on the mounting board 71. The packaging portion 7 includes a mounting board 71 on which a plurality of tape feeding mechanisms 11 are arranged and a packaging device 72 for packaging the electronic parts on a PCB 9. The plurality of tape feeding mechanisms 11 mountable on the packaging portion 7 are preset in the housing portion 2. The transfer portion 3 works to slidably transfer the tape feeding mechanisms 11 between the mounting board 71 of the packaging portion 7 and the housing portion 2. The control portion 4 controls operations of these respective portions. The carrier heads 61a, 61b are disposed in the vicinity of the housing portion 2 and on the transfer portion 3. The carriers heads 61a, 61b serve as read/write means for writing and reading the information from the data carrier 51 of the tape feeding mechanism 11. The production management instructing device 8 gives the control portion 4 an instruction to arrange the tape feeding mechanisms 11 on the mounting board 71. As illustrated in FIGS. 2(a) and 2(b) showing particulars of the transfer portion 3, a pair of guide rails 31 for slidably holding the tape feeding mechanism 11 are mounted on a baseplate 39 of the transfer portion 3 by use of a rail mounting plate 31a and a support plate 39a. At the same time, the guide rails 31 are so provided on the baseplate 39 as to be movable in crosswise directions (hereinafter called X directions) of the housing portion 2 and the mounting board 71 in a state where the both ends thereof face to the mounting board 71 and the housing portion 2. The guide rails 31 are grooved in their lengthwise directions (hereinafter called Y directions). Embedded in the bottom of the grooves are two pinions 331 respectively engaging with racks 13 formed on the tape feeding mechanism 11 by partially cutting the support plate 39a (the pinion 331 is drawn large enough to see easily). The pinions 331 are each connected to a pinion driving motor 33 rotating through a belt 32 and thereby rotated synchronously. The symbols 32a, 32b, 32e represent pulleys to be rotated. Further, the symbols 32c, 32d designate shafts for connecting the pulleys 32 to the pinions 331, 331. The pinion driving motor 33 is provided to move with the X-directional movements of the guide rails 31 on the baseplate 39. The tape feeding mechanism 11 is carried in the Y directions by driving the pinion driving motor 33. Note that chucks 34a, 34b are provided in the vicinities of both ends of the guide rails 31. The chuck 34a chucks the part feeding mechanism disposed in the housing portion 2, while the chuck 34b chucks the tape feeding mechanism 11 disposed on the mounting board 71. The chucks 34a, 34b are so provided as to be movable in the directions Y through first driving units 35a, 35b each moving along a rod. The both ends of these rods are respectively fixed to fixing plates 35c, 35d and 35e, 35f of the baseplate 39. The chuck 34a chucks the tape feeding mechanism 11 between the housing portion 2 and the guide rails 31 and then transfers it. The chuck 34b chucks the tape feeding mechanism 11 between the mounting board 71 and the guide rails 31 and then transfers it. Further, these chucks 34a, 34b move forward and backward along the guide rails 31 through rods of second driving units 36a, 36b respectively secured to the first driving units 35a, 35b in the directions X.

In this case, the first and second driving units 35a, 35b and 36a, 36b involving the use of cylinders are disposed on the baseplate 39 mounted with the guide rails 31 and move with the X-directional movements of the guide rails 31.

A slide guide 37 containing a ball screw 371 and a guide 38 are disposed in parallel in the X directions of the guide rails 31, thus supporting the guide rails 31. The ball screw 371 formed in the slide guide 37 is connected to a driving motor 372 thereof. The lower parts of the guide rails 31 are engaged with the ball screw in the slide guide 37. The guide rails 31 move in the X directions with rotations of the ball screw.

Further, when the tape feeding mechanism 11 passes through the guide rails 31, the electronic part information is read and written to the data carrier 51 thereof. For this purpose, the carrier head 61b serving as the read/write means is disposed on the baseplate 39 of the transfer portion 3.

The housing portion 2 is partitioned into upper and lower sections. A stocker 21 in the shape of a rack stocks the tape feeding mechanisms 11. Four stocker guides 22b (though not partially seen because of being shielded by the stocker 21) are so provided on the side surfaces of the stocker 21 in up-and-down directions as to be fitted to rods 22a having their ends fixed to an upper plate 25 located upward and a lower plate 26 located downward. An end of a ball screw 23 is rotatably connected to a fixing plate 27 fixed to the side surface of the stocker 21. A stocker motor 24 is connected to the ball screw 23 and attached to the lower plate 26 to drive the ball screw 23. Note that the fixing plate 27 is holed to receive insertions of two lengths of rods 22a, the holes being formed at a large spacing between the rods 22a. The stocker 21 moves in the up-and-down directions (Z directions) with rotations of the ball screw 23. The upper and lower sections of the stocker 21 are thereby switched over corresponding to a heightwise position of the guide rails 31 of the transfer portion 3. The stocker 21 in accordance with this embodiment stocks 15 tape feeding mechanisms 11 arranged both in the upper stage and in the lower stage.

The control portion 4 controls the operation of each constructive member described above. Carrier heads 61a, 61b act as interfaces when writing the information on the kinds, the types and the number of the electronic parts to the data carrier 51 of the tape feeding mechanism 11.

The production management instructing device 8 outputs, to the control portion 4, an instruction about the electronic parts to be packaged on the PCB 9. At the same time, this instruction is visually displayed on the display unit, thus giving an indication to the worker.

The packaging portion 7 is constructed of: the mounting board 71 on which the plurality of tape feeding mechanisms 11 are arranged in the X directions; a packaging head 73 for adsorptively picking up the electronic part from the tape feeding mechanism 11 by an absorptive action; a packaging device 72 for packaging, or placing, the electronic part on the PCB 9 by moving the packaging head 73 in the directions X, Y and Z; and a conveyor belt 74 for conveying the PCB 9 in the X directions. The conveyor belt 74 conveys the PCB on which the electronic part is packaged (assembled) to the packaging device 72. The conveyor belt 74 also places the PCB in a packaging position and conveys the PCB after packaging.

Next, the operation of this embodiment will be explained.

TABLE 1

| Name of PCB produced: ABC-100 | | Number of PCBs produced: 300 | | |
|---|---|---|---|---|
| BSNO. | Type | Number required | Width | Shortage |
| 1 | AB11-101 | 300 | 8 | |
| 2 | BC12-680 | 600 | 8 | |
| 3 | DE13-507 | 900 | 12 | * |
| 4 | FG14-5R6 | 900 | 12 | * |
| 5 | HI15-30Y | 300 | 12 | |
| 6 | JK21-21R | 300 | 12 | |
| 7 | LM22-JR5 | 300 | 12 | |
| 8 | NO23-323 | 300 | 8 | |
| 9 | PQ24-100 | 300 | 8 | |
| 10 | RS23-23C | 900 | 12 | * |

TABLE 2

| Name of PCB produced: DEF-200 | | Number of PCBS produced: 500 | | |
|---|---|---|---|---|
| BSNO. | Type | Number required | Width | Shortage |
| 1 | DC60F77AZ2 | 500 | 12 | |
| 2 | DC60F55PT5 | 1000 | 12 | |
| 3 | DS2326TE85 | 500 | 8 | |
| 4 | DS2371YT12 | 1000 | 12 | |
| 5 | KRK04-2SC | 1500 | 12 | * |
| 6 | DITC-74HC | 1000 | 12 | |
| 7 | DITE-457M | 1500 | 8 | * |
| 8 | TE3-M4029 | 1000 | 8 | * |
| 9 | TE4-M574R | 500 | 8 | * |
| 10 | KRK06-432 | 500 | 8 | |

TABLE 3

| STNO. | Type | Number of remains | Width |
|---|---|---|---|
| 1 | AB11-101 | 810 | 8 |
| 2 | BC12-680 | 820 | 17 |
| 3 | DE13-507 | 830 | 18 |

TABLE 3-continued

| STNO. | Type | Number of remains | Width |
|---|---|---|---|
| 4 | FG14-5R6 | 840 | 19 |
| 5 | HI15-30Y | 850 | 12 |
| 6 | Empty | | |
| 7 | Empty | | |
| 8 | DC60F77AZ2 | 2210 | 12 |
| 9 | DC60F55PT5 | 1220 | 12 |
| 10 | DS2326TE85 | 950 | 8 |
| 11 | DS2371YT12 | 1300 | 8 |
| 12 | Empty | | |
| 13 | Empty | | |
| 14 | Empty | | |
| 15 | SEL-556N | | |
| 16 | JK21-21R | 810 | 12 |
| 17 | LM22-J5R | 825 | 12 |
| 18 | NO23-323 | 835 | 8 |
| 19 | PQ24-100 | 845 | 8 |
| 20 | RS23-23C | 855 | 12 |
| 21 | Empty | | |
| 22 | Empty | | |
| 23 | DITC-74HC | 3590 | 12 |
| 24 | DITE-457M | 1200 | 8 |
| 25 | TE3-M4029 | 680 | 8 |
| 26 | Empty | | |
| 27 | KRK06-432 | 2700 | 8 |
| 28 | Empty | | |
| 29 | Empty | | |
| 30 | SEL-084TL | | |

Table 1 shows the PCB information outputted from the production management instructing device 8 to the control portion 4. The information is displayed in the control portion 4.

More specifically, the PCB named ABC-100 is packaged with the electronic parts of BSNOs.1~10 (BSNO. is an abbreviation of Part Placement NO. indicating the order of arrangement on the mounting board 71). Three hundreds of PCBs are produced. In this case, the information indicates that three hundreds of electronic parts named AB-11-101 and six hundreds of electronic parts named BC12-680 are, as a shown in Table 1, needed for production.

The control portion 4 compares, when inputted, this information with the information on the tape feeding mechanisms 11 stocked in the stocker 21.

Table 3 shows the information on the tape feeding mechanisms stocked in the stocker 21. STNOs.1~15 indicates the upper section of the stocker, while STNOs.16~30 indicates the lower section thereof. To be specific, in the upper section, the tape feeding mechanism having a width of 8 mm includes 810 pieces of electronic parts AB11-101 and 820 pieces of electronic parts BC12-680. No tape feeding mechanism is stocked in some locations (empty locations).

As a result of comparison between Table 1 and Table 3, if the parts required are not prepared, or if apparently deficient, though prepared, during the production, the control portion 4 informs the worker of this fact shown in the column of shortage in Table 1 through the display unit of the control portion 4 (known from the mark * in Table 1). In this case, the worker is informed of the shortages of the electronic parts of BSNOs.3, 4, 10.

Therefore, the worker supplies and stocks the stocker 21 with the notified tape feeding mechanisms 11 in the empty locations (locations in which no tape feeding mechanism is stocked in the stocker 21, e.g., STNOs. 6, 7, 12, 13, 14, 21, 22 . . . ). On the occasion of this stocking, the information (the names and the number of remains of the electronic parts) on the electronic parts is written to the data carrier 5 of the empty tape feeding mechanism 11 which has been newly fitted with a tape reel 12 by means of the carrier head 61a in the vicinity of the stocker 21. On the other hand, the information on the electronic parts is read from the data carrier 51 of the tape feeding mechanism 11 including its data carrier 5 to which the electronic part information has already been written. Further, in any case, the placing location of the tape feeding mechanism 11 stocked in the stoker 21 with the notification is inputted to the control portion 4.

With the operations described above, when the necessary parts are stocked in the stocker 21, the tape feeding mechanisms 11 are arranged on the mounting board 71 in the predetermined arranging manner. Namely, to start with, the stocker 21 is moved in the direction Z to set the tape feeding mechanism 11 within the stocker 21 in a heightwise position enough to be chucked by the chuck 34a in accordance with the instruction of the control portion 4, this tape feeding mechanism 11 being conveyed to the mounting board 71. Simultaneously, the guide rials 31 move in the direction X to such a position that the designated tape feeding mechanism 11 stocked in the stocker 21 can be chucked by the chuck 34a.

Then, the chuck 34a is moved toward the stocker 21 by the first driving unit 35a. The chuck 34a is closed, thus chucking the tape feeding mechanism 11. Thereafter, the chuck 34a is moved toward the mounting board 71 by the first driving unit 35a. The tape feeding mechanism 11 is conveyed up to a position enough to engage the racks 13 of the mounting board 71 with the pinions disposed on the guide rails 31. Then, the chuck 34a is opened to release the tape feeding mechanism 11 from being chucked. The chuck 34a moves further toward the mounting board 71, thus separating from the tape feeding mechanism 11.

Next, the control portion 4 operates the second driving unit 35b to move the chuck 34a back to a position in the direction X enough not to hinder the movement of the tape feeding mechanism 11 on the guide rails 31. Thereafter, the pinions are rotated by the driving the pinion driving motor 33, thereby moving the tape feeding mechanism 11 along the guide rails 31 toward the mounting board 71. In the course of this movement, when the data carrier 51 of the tape feeding mechanism 11 is positioned in a face-to-face relationship to the carrier head 61b, the tape feeding mechanism 11 is stopped. Then, the carrier head 61b reads a content of the data carrier 51 of the tape feeding mechanism 11 and collates it with the information in the control portion 4. As a result of this collation, if not coincident in terms of the kind and the type of the electronic parts, the electronic parts are returned to the stoker by the reverse operations, and the worker is informed of this return. Thereafter, the chuck 34a is moved toward the housing portion 2 in the direction Y by means of the first driving unit 35a.

Whereas if coincident, the guide rails 31 are moved together with the baseplate 39 in the direction X and aligned in a designated position on the mounting board 71. Thereafter, the pinion driving motor 33 is driven to rotate the pinions. The tape feeding mechanism 11 moves toward the mounting board 71 up to such a position that the racks 13 disengage from the pinions. Next, the second driving unit 36b is operated to advance the chuck 34b on the guide rails 31. Thereafter, the first driving unit 35b is operated to thrust the tape feeding mechanism 11 chucked by the chuck 34b toward the mounting board 71. The tape feeding mechanism 11 is completely transferred to a predetermined position on the mounting board 71. After this transfer, the chuck 34b is opened and moved back (in the direction Y). The chuck 34b is further moved back (in the direction X) through the second driving unit 36b. Similarly, all the designated tape feeding mechanisms 11 are sequentially transferred to the predetermined positions on the mounting board 71 and thus located.

Thereafter,the packaging portion 7 is driven. The packaging head 73 of the packaging device 72 adsorptively picks up the electronic part from the tape feeding mechanism 11 of the mounting board 71 and packages the electronic part on the PCB 9. When packaging on the single piece of PCB 9 comes to an end, the conveying belt 74 operates to convey the PCB 9 to an unillustrated next process. Simultaneously, the PCB 9 for next packaging is transferred to a packaging position from the unillustrated process.

With the operations described above, the electronic parts continue to be packaged. Then, the number of remains of the electronic parts of any of the tape feeding mechanisms 11 on the mounting board 71 becomes 0. A signal thereof is transmitted to the control portion 4. In response to this signal, the control portion 4 acts to convey the tape feeding mechanism 11 to an empty location of the stocker 21 from the mounting board 71 by the operations opposite to the above-mentioned. In the course of this conveyance, the carrier head 61b rewrites the content (the number of remains) of the data carrier with a reduction by the number employed for packaging on the PCB (the number of remains is herein 0). Effected then is a replacement with the same kind of tape feeding mechanism 11 stocked previously in the stocker 21. The worker removes the tape feeding mechanism 11 in which the number of remains of the electronic parts is 0, this mechanism being returned to the stocker 21 from the mounting board 71.

Table 2 shows the information about a PCB for next packaging and the electronic parts to be packaged. When this information is transmitted from the production management instructing device 8 to the control portion 4, the control portion 4 judges the kind of the electronic parts that are to lack and informs the worker of this kind of electronic parts. The worker stocks the stocker 21 with the tape feeding mechanisms 11 in the same way as the above-mentioned. In this case, the tape feeding mechanisms 11 including the electronic parts of BSNOs.5, 7, 8 and 9 are stocked.

When the number of the packaged PCBs reaches a predetermined number, packaging on the next kind of PCB is conducted. For this purpose, there is performed a stage replacement to replace the tape feeding mechanism 11 on the mounting board 71 with the tape feeding mechanism 11 in the stocker 21 in the same manner as that described above.

During this stage replacement, when the tape feeding mechanism 11 is returned to the stocker 21, the carrier head 61b rewrites the information on the number of remains of the electronic parts to the data carrier 51 of the tape feeding mechanism 11.

The embodiment discussed above is capable of corresponding directly to the stage replacement as well as to the out-of-stock of the parts. Further, the information about the parts stored in the tape feeding mechanism 11 is always held in the data carrier 51 thereof. Hence, the tape feeding mechanism 11 returned to the stocker 21 is removed from the stocker 21. When stocked next in the stocker 21, the information thereof is read through the carrier head 61a. It is thus possible to read exactly the information on the type and the number of remains of the parts can be read. The information on the electronic parts can be thereby accurately grasped.

Figure 4:
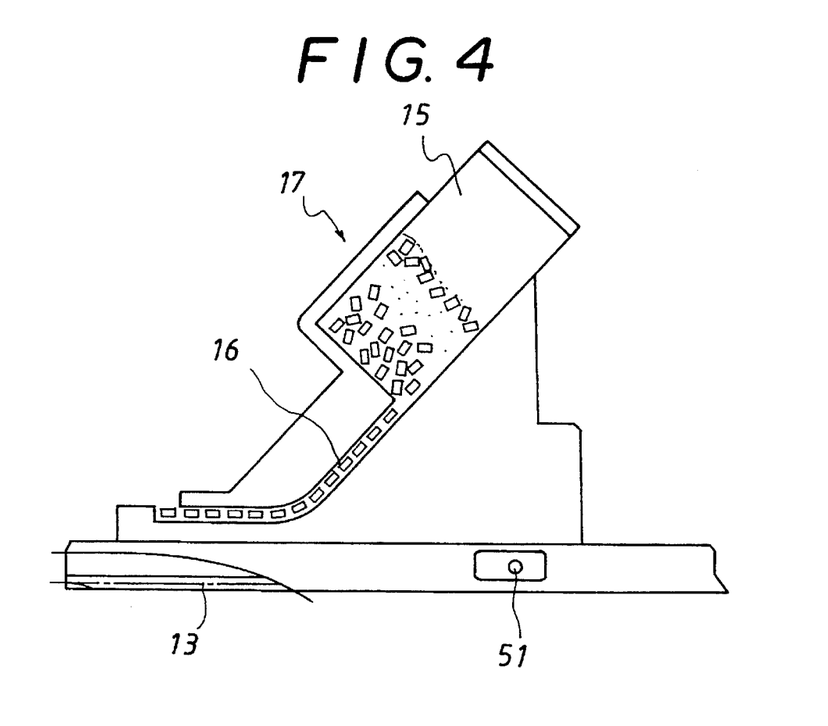
FIG. 4 is a side view illustrating a modified example of a part supply unit in the PCB electronic part automatic packaging apparatus of this invention.

FIG. 4 illustrates a modified example of the part supply unit 17. The part supply unit 17 takes such a structure that a multiplicity of electronic parts are accommodated in a bulk cassette 15 and supplied by taking them one by one out of a chute 16. The data carrier 51 is provided on the side surface thereof, whereby the part supply unit 17 can be used as in the case of the tape feeding mechanism 11.

[Embodiment 2]

Figure 5:
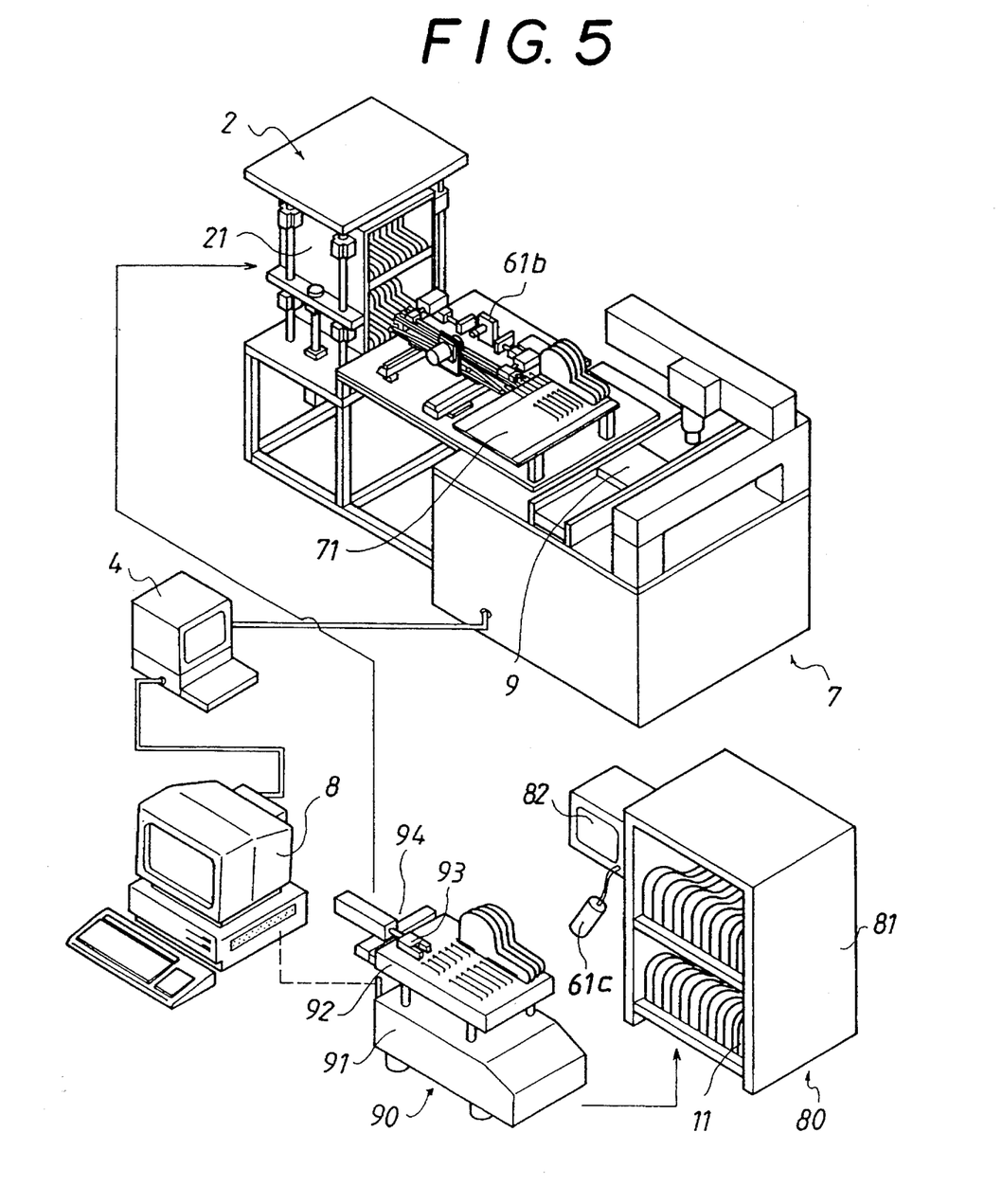
FIG. 5 is a perspective view showing the whole of a second embodiment of the PCB electronic part automatic packaging apparatus of this invention.

FIG. 5 shows a second embodiment of this invention. The same components as those in the embodiment 1 are correspondingly marked with the like numerals, and an overlapped explanation will be omitted. In accordance with this embodiment, the tape feeding mechanism 11 includes a part stocker 80 and a conveying vehicle 90. The part stocker 80 stocks the tape feeding mechanisms 11 at multi-stages. The conveying vehicle 90 reciprocate between the part stocker 80 and the housing portion 2 while mounted with the tape feeding mechanisms 11. The conveying vehicle 90 travels in conformity with an instruction issued from a radio system (unillustrated) of the production management instructing device 8.

This conveying vehicle 90 is constructed of a traveling unit 91, an elevator plate 92, a conveyance chuck 93 and a conveyance driving unit 94. The traveling unit 91 serves as a traveling means. The elevator plate 92 is mounted with the tape feeding mechanisms 11 in a side-by-side relationship. At the same time, the elevator plate 92 moves up and down to be flush with heights of shelves of the stocker 21 and of the part stocker 80. The conveyance chuck 93 chucks the tape feeding mechanisms 11 in the part stocker 80 as well as in the stocker 21. The conveyance driving unit 94 drives the conveyance chucks 93 right and left or back and forth.

The part stocker 80 comprises shelves 81, a carrier head 61c and a display unit. The tape feeding mechanisms are stored on the shelves 81. The carrier head 61c writes the electronic part information to the data carrier 51 of the tape feeding mechanism 11. The display unit 82 indicates stocked and out-of-stock situations. This part stocker 80 stocks the tape feeding mechanisms 11 and constitutes partially the housing portion 2 on the side of the transfer portion.

The following is an explanation of how the automatic packaging apparatus in this embodiment operates.

The production management instructing device 8 transmits the information on the PCB for next packaging as shown in Table 1 to the control portion 4. Then, the control portion 4 compares this information with the information (see Table 3) of the tape feeding mechanisms 11 stocked in the stocker 21. The information on the parts that will apparently, even when the necessary parts may or may not exist, lack during the production is fed back to the production management instructing device 8. The production management instructing device 8 thereby outputs, to the conveying vehicle 90, an instruction to convey the tape feeding mechanism having these parts to the stocker 21 from the part stocker 80.

The conveying vehicle 90 travels to the part stocker 80. The elevator plate 92 descends or ascends up to a height where the designated tape feeding mechanism 11 is stored. The conveyance chuck 93 and the conveyance driving unit 94 operate to transfer the designated tape feeding mechanism 11 onto the conveying vehicle 90.

Next, the conveying vehicle 90 travels to the housing portion 2. The tape feeding mechanism 11 is set in the stocker 21 by the operations opposite to those described above. At this time, a setting location is indicated beforehand to the conveying vehicle 90 through the production management instructing device 8 from the production portion 4. Further, when the tape feeding mechanisms 11 are stored on the shelves 81 in the part stocker 80, the worker previously writes the type and the number of remains of the parts to the data carrier 51 by use of the carrier head 61c. This writing process is done as in the embodiment 1. The tape feeding mechanisms 11 required are stocked in the stocker 21. Then, the tape feeding mechanisms 11 are arranged on the mounting board 71 pursuant to the predetermined arranging manner by the same operations as those in the embodiment 1, thus packaging the parts on the PCB 9.

While the electronic parts are continuously packaged, the number of remains of the electronic parts of any of the tape feeding mechanisms 11 on the mounting board 71 comes to 0. The signal thereof is transmitted to the control portion 4. In response to this signal, the tape feeding mechanisms 11 are conveyed to empty locations in the stocker 21 from the mounting board 71 by the operations reversal to the above-mentioned. In the course of this conveyance, the carrier head 61b rewrites the content (the number of remains) of the data carrier with a reduction by the number employed for packaging on the PCB (herein, the number of remains is 0). Conducted subsequently is a replacement with the same kind of tape feeding mechanism 11 stocked beforehand in the stocker 21. Next, the conveying vehicle 90 brings the tape feeding mechanism 11 with the number of remains of the parts being 0 back to the part stocker 80, this tape feeding mechanism 11 being returned to the stocker 21 from the mounting board 71. When this tape feeding mechanism 11 goes back to the part stocker 81, the worked is informed of this by display it on the display unit 82.

When the information, shown in Table 2, about the PCB for next packaging is transmitted to the control portion 4 during packaging on the PCB, the control portion 4 judges the kind of the electronic parts that are to lack. The conveying vehicle 90 is informed of this through the production management instructing device 8. The conveying vehicle 90 stocks the stocker 21 with the tape feeding mechanism 11 in the same way as the above-mentioned. When the number of the packaged PCBs reaches a predetermined value, there is effected the stage replacement to replace the tape feeding mechanism 11 on the mounting board 71 with the tape feeding mechanism 11 in the stocker 21 for packaging on the next kind of the PCB.

During this stage replacement, when the tape feeding mechanism 11 is returned to the stocker 21, the carrier head 61b rewrites the information, about the number of remains of the parts, of the data carrier 51 of the tape feeding mechanism 11.

This embodiment is capable of corresponding to the stage replacement as in the embodiment 1. In accordance with this embodiment, however, the worker may manage the part stocker 80, whereby an unmanned system can be attained.

It is apparent that, in this invention, a wide range of different working modes can be formed based on the invention without deviating from the spirit and scope of the invention. This invention is not restricted by its specific working modes except being limited by the appended claims.

What is claimed is:

1. An apparatus for automatically mounting electronic parts on a printed circuit board, comprising: a housing portion for housing a plurality of part supply units each for holding a plurality of electronic parts in a suppliable manner; packaging means, including a mounting board on which a plurality of part supply units are set, for removing respective electronic parts from respective part supply units on said mounting board and mounting the electronic parts at predetermined locations on a printed circuit board; transfer means for transferring respective part supply units from the housing portion to the mounting board; information storage means provided in respective part supply units in which information concerning the type and quantity of the electronic parts is stored and can be read from and written to; read/write means disposed in the housing portion and said transfer means for reading electronic part information from and writing electronic part information to the information storage means; production management instructing means for supplying a production schedule output including the quantity of printed circuit boards to be assembled and the types and quantities of electronic parts required for every printed circuit board to be assembled; and control means for controlling the housing portion, the packaging means, the transfer means and the read/write means in accordance with the production schedule output, for computing a remaining number of respective types of electronic parts, comparing the remaining number with the required number of each type of electronic part determined by the production management instructing means, and outputting information concerning the types and quantities of electronic parts in an out-of-stock condition.

2. The apparatus according to claim 1; wherein at least one part supply unit comprises a tape feeding mechanism.

3. The apparatus according to claim 2; wherein the tape feeding mechanism comprises a tape fitted with the electronic parts, a reel for feeding out the tape, a reel for taking up the tape, and a data carrier unit for storing information concerning the type and quantity of electronic components contained therein.

4. The apparatus according to claim 2; wherein at least one part supply unit comprises a bulk cassette for accommodating a multiplicity of electronic parts, a chute for sequentially feeding electronic parts and a data carrier unit for storing information concerning the type and quantity of electronic components therein.

5. The apparatus according to claim 1, further comprising a remote part stocker for stocking a plurality of part supply units, and conveying means for traveling between the remote part stocker and the housing portion for conveying respective part supply units from the remote stocker to the housing portion.

6. The apparatus according to claim 5; wherein the conveying means comprises a conveying vehicle comprising a traveling unit relatively movable between the remote part stocker and the housing portion having vertically movable mounting means so as to be selectively flush with respective locations of the housing portion, a conveyance chuck for chucking respective part supply units both in said remote part stocker and in said housing portion and a conveyance driving unit for driving said conveyance chuck so as to transfer respective part supply units between the remote part stocker and the housing portion.

7. The apparatus according to claim 5; wherein the remote part stocker comprises a plurality of shelves for storing respective part supply units.

8. The apparatus according to claim 1; wherein the housing portion has of multi-staged shelves for storing the part supply units.

9. The apparatus according to claim 1; wherein the transfer means includes guide rails for slidably holding respective part supply units, and means for conveying respective part supply units formed under the guide rails.

10. An automatic assembly device for mounting electronic components on a printed circuit board, comprising: housing means for housing a plurality of electronic component dispensing devices each containing a plurality of electronic components in a dispensable fashion; a mounting portion from which electronic components are removed for mounting on a printed circuit board; means for transferring respective electronic component dispensing devices from the housing means to the mounting portion; mounting means for transferring respective electronic components from selected component dispensing devices to predetermined locations on the printed circuit board; data storage means located in each respective electronic component dispensing device for storing information concerning the type and quantity of the electronic components therein; production management means for determining a production schedule based upon the type of printed circuit board to be assembled, the types and quantities of electronic components needed for assembly of the printed circuit board and the predetermined locations at which each electronic component is to be mounted and for providing a production schedule output in accordance therewith; control means including means for reading from and writing to the data storage means for controlling the housing means, the mounting means and the transferring means in accordance with the production schedule output of the production management means, for determining the residual number of respective electronic components of each type, and for comparing the respective residual quantities with the output of the production management means to whether an adequate supply of respective electronic components exists.

11. An automatic assembly device according to claim 10; further comprising display means for displaying the type and quantities of respective electronic components.

12. An automatic assembly device according to claim 10; further comprising display means for displaying the type and quantities of respective electronic components determined to be in an out-of-stock condition when an inadequate quantity of said electronic components exists.

13. An automatic assembly device according to claim 10; wherein at least one electronic component dispensing device comprises a tape feeding mechanism.

14. An automatic assembly device according to claim 10; further comprising a remote storage unit for storing a plurality of electronic component dispensing devices each having a plurality of electronic components therein.

15. An automatic assembly device according to claim 14; further comprising a conveying means for traveling between the remote storage unit and the housing portion for transferring electronic component dispensing devices therebetween.

16. An automatic assembly device according to claim 15; wherein the conveying means is responsive to a command issued by the production management means.

17. An automatic assembly device according to claim 10; further comprising display means for displaying information output by the production management means.

18. An automatic assembly device according to claim 10; wherein at least one electronic component dispensing device comprises a cassette receptive of a plurality of electronic component and a dispenser for selectively sequentially dispensing the electronic components.

19. An automatic assembly device according to claim 10; wherein the control means includes means for writing to the respective data storing means so as to keep count of the number of electronic components in respective electronic component dispensing means for maintaining a count of remaining electronic components.

* * * * *